United States Patent [19]

Miyazaki et al.

[11] Patent Number: 4,668,875
[45] Date of Patent: May 26, 1987

[54] WAVESHAPING CIRCUIT

[75] Inventors: Masaaki Miyazaki; Mitsuaki Ishii, both of Himeji, Japan

[73] Assignee: Mitsubishi Denki Kabushiki Kaisha, Tokyo, Japan

[21] Appl. No.: 849,440

[22] Filed: Apr. 8, 1986

[30] Foreign Application Priority Data

Apr. 9, 1985 [JP] Japan .................................. 60-77112

[51] Int. Cl.⁴ ........................................... H03K 17/20
[52] U.S. Cl. ................................. 307/106; 307/10 R; 307/318; 307/310; 307/362; 328/74
[58] Field of Search ............ 307/31, 33, 10 R, 10 BP, 307/10 LS, 64, 105, 106, 107, 108, 109, 260, 265, 266, 267, 268, 310, 317 R, 296 R, 318, 362, 520, 542, 543, 592, 597, 608, 362, 360, 361, 363, 364, 110, 132 E, 141; 328/74; 333/214, 215, 165, 167, 172, 181

[56] References Cited

U.S. PATENT DOCUMENTS

| | | | |
|---|---|---|---|
| 3,403,265 | 9/1968 | Apfelbeck | 307/363 X |
| 3,484,702 | 12/1969 | Moore | 307/362 X |
| 3,648,195 | 3/1972 | Marino | 307/267 X |
| 3,790,894 | 2/1974 | Iizuka et al. | 307/362 X |
| 3,798,559 | 3/1974 | Tomita et al. | 307/362 X |
| 3,914,735 | 10/1975 | Guillaume | 307/10 R X |
| 4,216,653 | 8/1980 | Nakase et al. | 60/276 |
| 4,536,667 | 8/1985 | Masuda | 307/296 R X |

OTHER PUBLICATIONS

"CMOS NAND GATE", Integrated Digital Electronics, Prentice-Hall, Inc., 1979, p. 302.
"Halbleiter-Schaltungstechnik", Springer-Verlag, New York, 1980, pp. 558-559.

Primary Examiner—Charles D. Miller
Assistant Examiner—Shik Luen Paul Ip
Attorney, Agent, or Firm—Leydig, Voit & Mayer

[57] ABSTRACT

A waveshaping circuit for providing logic levels from a voltage source to a digital circuit comprising a pull-up (or pull-down) resistor for converting the voltage source into voltage signals of predetermined values, a low-pass filter connected to the resistor for eliminating noise components of the voltage signals, a voltage limiter for limiting the voltage signals to a predetermined voltage range, and a voltage divider for receiving and dividing the voltage signals to supply output voltages of high or low logic levels to the digital circuit.

4 Claims, 3 Drawing Figures

WAVESHAPING CIRCUIT

BACKGROUND OF THE INVENTION

The present invention relates to a waveshaping circuit for the switch input signal of a digital integrated circuit such as a microcomputer.

FIG. 1 is a circuit diagram of a prior-art waveshaping circuit of the type specified above. In the figure, numeral 1 designates a D.C. power source which is, for example, a battery of 14 V for automobiles, numeral 100 a control device which is connected with the power source 1, and numeral 101 a switch which is connected with the control device 100. Numeral 2 designates a voltage regulator circuit by which the voltage of 14 V supplied from the D.C. power source is regulated to a voltage of 5 V. A pull-up resistor 3 having a resistance of 820Ω is connected between a 14 V voltage line and the switch 101, a resistor 4 of 6.8 kΩ has its one end connected to the node of the resistor 3 and the switch 101, and a capacitor 5 having a capacitance of 10 μF is connected with the other end of the resistor 4 and constitutes a low-pass filter. A protective diode 12 serves to limit a voltage magnitude when a minus voltage is input. A resistor 13 of 2.2 kΩ provides a voltage divider together with the resistor 4, an N-P-N transistor 14 has its base connected to the output of the voltage divider, and a resistor 16 of 10 kΩ is connected to the collector of the transistor 14 and a 5 V line being the output of the voltage regulator circuit 2. Shown at numeral 10 is a microcomputer which receives the collector voltage of the transistor 14 as a digital input signal.

Next, the operation of the circuit shown in FIG. 1 will be described. When the switch 101 is in its open state, the transistor 14 is supplied with a base current through the resistors 3 and 4. Therefore, this transistor 14 is turned 'on', and the input voltage E of the microcomputer 10 becomes 0 (zero) volt. On the other hand, when the switch 101 is in its closed state, the voltage of a node A becomes 0 (zero) volt. Therefore, the transistor 14 is turned 'off', and the voltage of the node E becomes 5 V.

The voltage of the node A according to which the transistor 14 changes into the 'on' or 'off' state is determined by the base-emitter voltage (approximately 0.7 V) of the transistor 14 and the voltage divider composed of the resistors 4 and 13 because the current of the transistor 14 is high. In the case of FIG. 1, the transistor 14 turns 'on' when the voltage of the node A is approximately 2.9 volts or above, and it turns 'off' when the voltage is below the same value. The capacitor 5 forms together with the resistor 4, a low-pass filter which prevents the transistor 14 from erroneously operating due to noise that is induced in the harness for connections between the switch 101 and the control device 100.

Since the prior-art waveshaping circuit is arranged as described above, it has the disadvantage that the comparison level for the input voltage is subject to fluctuation when the base-emitter voltage of the transistor 14 changes according to the ambient temperature thereof. Another problem is high cost when a transistor 14 is used.

SUMMARY OF THE INVENTION

This invention has as its objective the elimination of the drawbacks as mentioned above and has for its more specific object to provide a waveshaping circuit which is inexpensive and is little influenced by ambient temperatures and noise, etc. The waveshaping circuit according to this invention uses the threshold level of a ditial IC as a level for comparison with an input voltage, instead of the base-emitter voltage of a transistor.

A pull-up resistor (or pull-down resistor) in this invention converts the on/off state of a switch into a voltage signal, the signal has its noise component eliminated by a low-pass filter, the resulting voltage signal is divided by a voltage divider to be converted into the logic level of a digital IC, and this level is used as the input signal of the digital IC.

BRIEF DESCRIPTION OF THE DRAWINGS

In the drawings, the same symbols indicate identical or corresponding portions.

DESCRIPTION OF THE PREFERRED EMBODIMENTS

Figure 1:
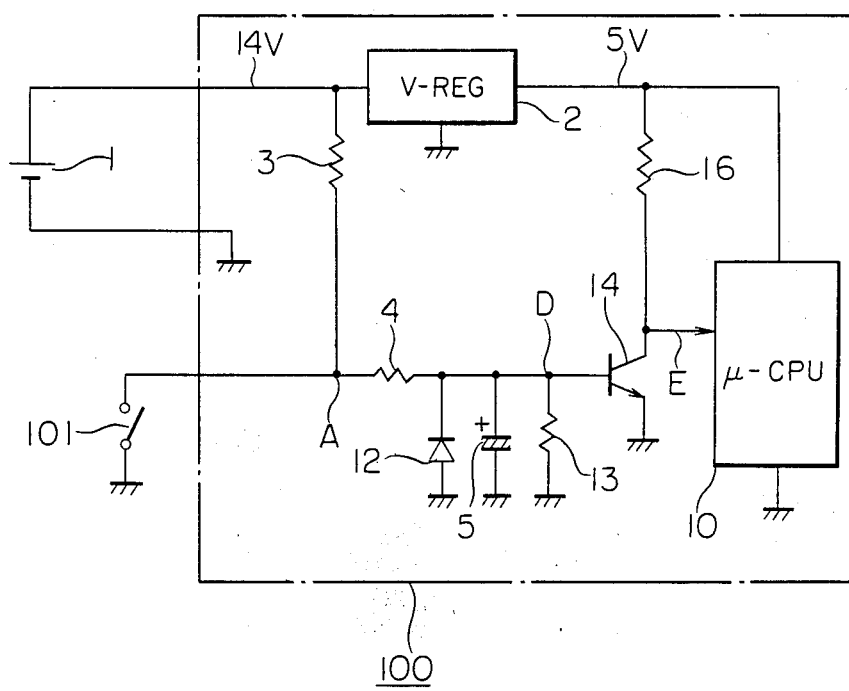
FIG. 1 is a circuit diagram showing a prior-art waveshaping circuit.
Figure 2:
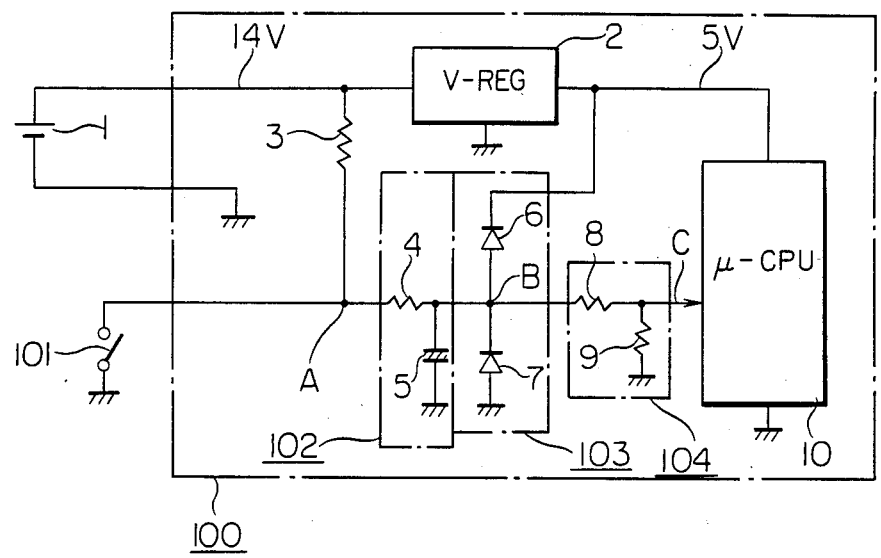
FIG. 2 is a circuit diagram showing a waveshaping circuit according to an embodiment of this invention.

Now one embodiment of this invention will be described. In FIG. 2, numeral 4 designates a resistor of a resistance of 8.2 kΩ which has its one end connected to the node A between a switch 101 and a pull-up resistor 3 having a resistance of 820 Ω, and numeral 5 a capacitor of a capacitance of 2.2 μF which is connected with the resistor 4 so as to construct a low-pass filter 102. A diode 6 limits the maximum value of the output voltage (at a point B) of the low-pass filter 102 to approximately 5.6 V, while a diode 7 limits the minimum value of the output voltage (at the point B) of the low-pass filter 102 to −0.6 V. Resistors 8 and 9 provide a voltage divider 104 by which the output of the low-pass filter 102 subjected to voltage limitation by a voltage limiter 103 is divided to a value of approximately ⅜. The resistor 8 has a resistance of 4.7 kΩ, while the resistor 9 has a resistance of 10 kΩ.

Next, the operation of the embodiment will be described. When the switch 101 is in its open state, the voltage of the point B is about to become 5.9 V. Since, however, this voltage is limited to 5.6 V, the voltage of a point C being the output of the voltage divider 104 becomes 3.8 V. Then, the input state of a microcomputer 10 is detected as being 'high' because the threshold voltage thereof is approximately 1.2 V.

On the other hand, when the switch 101 is in its closed state, all the points A, B and C are of 0 (zero) V. Since the voltage of the point C is below the threshold voltage, the input state is detected as being 'low'.

The microcomputer 10 detects the 'high' input when the voltage of the point A is over 2.7 V, and it detects the 'low' input when the voltage of the point A is below 2.7 V. The threshold voltage of the microcomputer 10 formed of NMOS FET's is little influenced by ambient temperaures, and is therefore stable.

In the environments of automobiles etc., the ground (GND) potential differs depending upon places and might fluctuate between −0.5 V and +1.0 V, and noise in excess of ±100 V might arrive. Even in such cases, however, the voltage of the point B is limited within the range of −0.6 V to +5.6 V by the low-pass filter 102 and the voltage limiter 103. Therefore, the voltage of the point C becomes −0.4 V to +3.8, and the microcomputer 10 operates stably.

Figure 3:
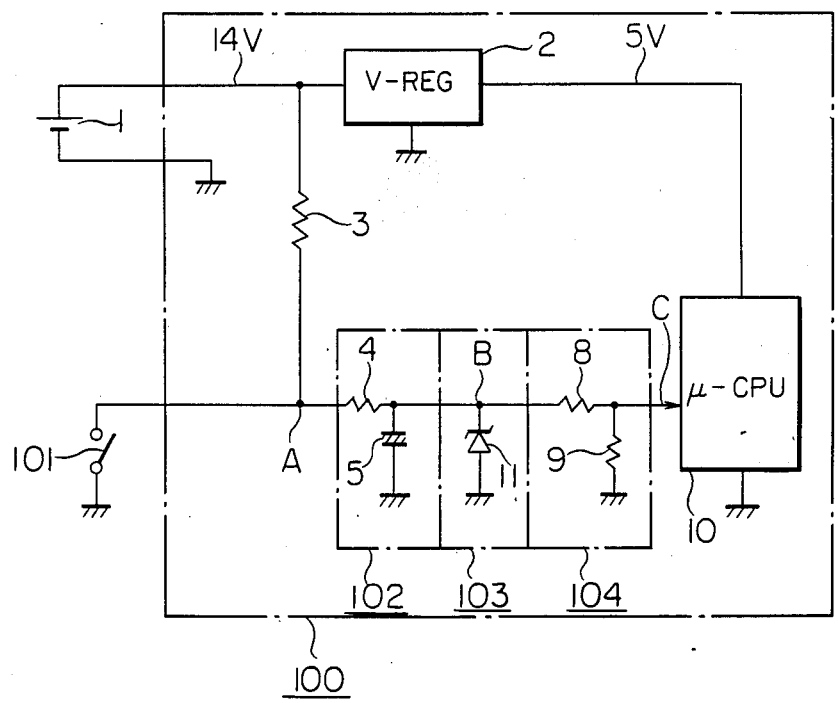
FIG. 3 is a circuit diagram showing another embodiment of this invention.

Although, in the above embodiment, the voltage limiter 103 has been constructed of the diodes 6 and 7, it can also be constructed of a Zener diode 11 as illustrated in FIG. 3.

In the embodiments, the voltage limiter 103 has been arranged at the stage succeeding the low-pass filter 102. However, similar effects are attained even when the low-pass filter 102 is arranged at the stage succeeding the voltage limiter 103 in order to make the effect of the low-pass filter more reliable.

As described above, according to the present invention, the threshold voltage of a digital IC such as a microcomputer is used as a comparison level, and an interface circuit is constructed of a low-pass filter, a voltage limiter and a voltage divider. The invention is therefore effective to provide a waveshaping circuit which is inexpensive, which is little influenced by ambient temperatures and which operates stably at all times even when noise of large amplitude arrives.

What is claimed is:

1. A waveshaping circuit for providing high and low logic levels from a voltage source to a digital circuit comprising means for converting said voltage source into voltage signals of predetermined values, a low-pass filter connected to said converting means for eliminating noise components of said voltage signals, a voltage limiter for limiting said voltage signals to a predetermined voltage range covering both the high and low logic levels, and a voltage divider for receiving and dividing said voltage signals to supply output voltages corresponding to high or low logic levels to the digital circuit.

2. A waveshaping circuit according to claim 1, wherein said voltage limiter comprises a first diode for providing an upper limit of said predetermined voltage range and a second diode for providing a lower limit of said predetermined voltage range.

3. A waveshaping circuit according to claim 1 wherein said voltage limiter comprises a Zener diode.

4. A waveshaping circuit according to claim 1 wherein said converting means includes a resistor.

* * * * *